United States Patent
Kim et al.

(10) Patent No.: US 12,256,495 B2
(45) Date of Patent: Mar. 18, 2025

(54) FLEXIBLE PRINTED CIRCUIT BOARD AND ELECTRONIC DEVICE INCLUDING THE SAME

(71) Applicant: SAMSUNG ELECTRONICS CO., LTD., Suwon-si (KR)

(72) Inventors: Kyeongho Kim, Suwon-si (KR); Gihyup Lee, Suwon-si (KR); Jeongseob Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 201 days.

(21) Appl. No.: 18/114,494

(22) Filed: Feb. 27, 2023

(65) Prior Publication Data
US 2023/0269874 A1    Aug. 24, 2023

Related U.S. Application Data

(63) Continuation of application No. PCT/KR2023/001912, filed on Feb. 9, 2023.

(30) Foreign Application Priority Data

Feb. 23, 2022 (KR) .......................... 10-2022-0023865
Mar. 28, 2022 (KR) .......................... 10-2022-0038318

(51) Int. Cl.
*H05K 1/11* (2006.01)
*H05K 1/02* (2006.01)
*H05K 1/14* (2006.01)

(52) U.S. Cl.
CPC ........... *H05K 1/117* (2013.01); *H05K 1/0298* (2013.01); *H05K 1/147* (2013.01); *H05K 2201/10189* (2013.01)

(58) Field of Classification Search
CPC ...... H05K 1/117; H05K 1/0298; H05K 1/147; H05K 2201/10189
(Continued)

(56) References Cited

U.S. PATENT DOCUMENTS 7,455,531 B2    11/2008   Hirabayashi et al.
11,456,238 B2    9/2022   Kamiya et al.
(Continued)

FOREIGN PATENT DOCUMENTS

EP          1109258        6/2001
JP       2001-177206       6/2001
(Continued)

OTHER PUBLICATIONS

Search Report and Written Opinion dated May 19, 2023 issued in International Patent Application No. PCT/KR2023/001912.

*Primary Examiner* — Andargie M Aychillhum
(74) *Attorney, Agent, or Firm* — Nixon & Vanderhye, P.C.

(57) ABSTRACT

According to various embodiments of the disclosure, an electronic device may include: a printed circuit board; a connector disposed on one surface of the printed circuit board and including a first contact portion and a second contact portion spaced apart from the first contact portion; and a flexible printed circuit board at least a part of which is connected to the connector. The flexible printed circuit board may include: two first areas formed on one surface of the flexible printed circuit board and each having a length in a width direction from one side or the other side of the one surface; and a second area formed between the first areas. Each of the first area and the second area may include a plurality of first terminals in contact with the first contact portion and disposed at intervals in the width direction of the flexible printed circuit board; and a plurality of second terminals in contact with the second contact portion and
(Continued)

spaced apart from the plurality of first terminals in a longitudinal direction of the flexible printed circuit board. In the first area, one end of the plurality of first terminals may be formed at a same position in the longitudinal direction of the flexible printed circuit board, and the plurality of second terminals are spaced apart from the plurality of first terminals by a first length, respectively. In the second area, at least some of the plurality of first terminals may be spaced apart from at least some of the plurality of second terminals by a second length, respectively. The first length may be greater than the second length.

20 Claims, 14 Drawing Sheets

(58) Field of Classification Search
USPC .......................................................... 361/749
See application file for complete search history.

(56) References Cited

U.S. PATENT DOCUMENTS

| | | |
|---|---|---|
| 2001/0034156 A1 | 10/2001 | Yamane |
| 2009/0311912 A1 | 12/2009 | Hemmi et al. |
| 2010/0212938 A1 | 8/2010 | Nakamura et al. |
| 2013/0083505 A1 | 4/2013 | Kobayashi |
| 2014/0127916 A1 | 5/2014 | Lee |
| 2016/0381789 A1* | 12/2016 | Rogers .............. H01L 21/02422 361/749 |
| 2018/0182722 A1 | 6/2018 | Kim et al. |
| 2018/0287302 A1* | 10/2018 | Kim ................... H01R 13/6466 |
| 2022/0216588 A1 | 7/2022 | Lee et al. |

FOREIGN PATENT DOCUMENTS

| | | |
|---|---|---|
| JP | 2005-079231 | 3/2005 |
| JP | 2008-112642 | 5/2008 |
| JP | 2010-199372 | 9/2010 |
| JP | 2013-080628 | 5/2013 |
| KR | 10-0531221 | 11/2005 |
| KR | 10-0922673 | 10/2009 |
| KR | 10-1451553 | 10/2014 |
| KR | 10-2015-0082043 | 7/2015 |
| KR | 10-2017-0132624 | 12/2017 |
| KR | 10-2103792 | 4/2020 |
| KR | 10-2020-0107815 | 9/2020 |
| KR | 10-2255501 | 5/2021 |
| KR | 10-2021-0099164 | 8/2021 |
| WO | 2020/021843 | 1/2020 |

* cited by examiner

FLEXIBLE PRINTED CIRCUIT BOARD AND ELECTRONIC DEVICE INCLUDING THE SAME

CROSS-REFERENCE TO RELATED APPLICATIONS

This application is a continuation of International Application No. PCT/KR2023/001912 designating the United States, filed on Feb. 9, 2023, in the Korean Intellectual Property Receiving Office and claiming priority to Korean Patent Application No. 10-2022-0023865, filed on Feb. 23, 2022, in the Korean Intellectual Property Office, and to Korean Patent Application No. 10-2022-0038318, filed on Mar. 28, 2022, in the Korean Intellectual Property Office, the disclosures of all of which are incorporated by reference herein in their entireties.

BACKGROUND

Field

The disclosure relates to a flexible printed circuit board and an electronic device including the same.

Description of Related Art

A flexible printed circuit board (FPCB) included in an electronic device may be connected to a connector having a zero insertion force (ZIF) structure.

The flexible printed circuit board may include two pads. Each of the two pads may have a plurality of terminals, which may be in contact with and electrically connected to contact points of a ZIF connector.

Each of the two pads (e.g., a first pad and a second pad) of the flexible printed circuit board may include a plurality of terminals that are arranged at regular intervals in the width direction of the flexible printed circuit board. The terminal included in the first pad and the terminal included in the second pad may be disposed to be spaced apart from each other in the longitudinal direction of the flexible printed circuit board.

In the flexible printed circuit board, the plurality of terminals may be arranged in a zigzag form. For example, the terminals included in each pad (e.g., the first pad, the second pad) are formed so that the positions of their one ends do not coincide in the longitudinal direction of the flexible printed circuit board, and the terminals formed to extend toward the counterpart pad (e.g., the second pad, the first pad) by a certain length may be alternately disposed along the width direction of the flexible printed circuit board.

In the case that the flexible printed circuit board is not completely connected to or, in an inclined direction, connected to the connector having the ZIF structure, a contact point of the connector may come into contact with a terminal other than a corresponding terminal due to the zigzag arrangement of the terminals included in the flexible printed circuit board. If the contact point of the connector is in contact with a non-corresponding terminal, a short circuit may occur in some of the plurality of terminals included in the circuit board, and a component connected to the short-circuited terminal may be damaged. Thus, there is a need for a flexible printed circuit board capable of not causing a short circuit even in case of being not completely connected to or, in an inclined direction, connected to the connector.

SUMMARY

Embodiments of the disclosure provide a flexible printed circuit board and an electronic device including the same capable of providing an arrangement that does not cause a short circuit even in the case where the flexible printed circuit board is not completely connected to or, in an inclined direction, connected to the connector.

According to various example embodiments of the disclosure, an electronic device may include: a printed circuit board; a connector disposed on one surface of the printed circuit board and including a first contact portion and a second contact portion spaced apart from the first contact portion; and a flexible printed circuit board at least a part of which is connected to the connector, wherein the flexible printed circuit board may include two first areas formed on one surface of the flexible printed circuit board and each having a length in a width direction from one side or the other side of the one surface; and a second area formed between the first areas, wherein each of the first area and the second area may include a plurality of first terminals in contact with the first contact portion and disposed at intervals in the width direction of the flexible printed circuit board; and a plurality of second terminals in contact with the second contact portion and spaced apart from the plurality of first terminals in a longitudinal direction of the flexible printed circuit board, wherein in the first area, one end of the plurality of first terminals may be formed at a same position in the longitudinal direction of the flexible printed circuit board, and the plurality of second terminals are spaced apart from the plurality of first terminals by a first length, respectively, wherein in the second area, at least some of the plurality of first terminals may be disposed to be spaced apart from at least some of the plurality of second terminals by a second length, respectively, and wherein the first length may be greater than the second length.

According to various example embodiments of the disclosure, a flexible printed circuit board connecting structure may include: a connector including a first contact portion and a second contact portion spaced apart from the first contact portion; and a flexible printed circuit board at least a part of which is connected to the connector, wherein the flexible printed circuit board may include two first areas formed on one surface of the flexible printed circuit board and each having a length in a width direction from one side or the other side of the one surface; and a second area formed between the first areas, wherein each of the first area and the second area may include a plurality of first terminals in contact with the first contact portion and disposed at intervals in the width direction of the flexible printed circuit board; and a plurality of second terminals in contact with the second contact portion and spaced apart from the plurality of first terminals in a longitudinal direction of the flexible printed circuit board, wherein in the first area, one end of the plurality of first terminals may be formed at a same position in the longitudinal direction of the flexible printed circuit board, and the plurality of second terminals are spaced apart from the plurality of first terminals by a first length, respectively, wherein in the second area, at least some of the plurality of first terminals may be spaced apart from at least some of the plurality of second terminals by a second length, respectively, and wherein the first length may be greater than the second length.

According to various example embodiments of the disclosure, a flexible printed circuit board may include: two first areas formed on one surface of the flexible printed circuit board and each having a length in a width direction from one side or the other side of the one surface; and a second area formed between the first areas, wherein each of the first area and the second area may include a plurality of first terminals disposed at intervals in the width direction of the flexible printed circuit board; and a plurality of second terminals spaced apart from the plurality of first terminals in a longitudinal direction of the flexible printed circuit board, wherein in the first area, one end of the plurality of first terminals may be formed at a same position in the longitudinal direction of the flexible printed circuit board, and the plurality of second terminals are spaced apart from the plurality of first terminals by a first length, respectively, wherein in the second area, at least some of the plurality of first terminals may be spaced apart from at least some of the plurality of second terminals by a second length, respectively, and wherein the first length may be greater than the second length.

The flexible printed circuit board and the electronic device including the same according to various example embodiments of the disclosure can provide a terminal arrangement structure that does not cause a short circuit even in the case where the flexible printed circuit board is not completely connected to or, in an inclined direction, connected to the connector.

The flexible printed circuit board and the electronic device including the same according to various example embodiments of the disclosure may include, at least in part, a terminal arrangement structure alternately having extension regions to improve the rigidity of the flexible printed circuit board.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
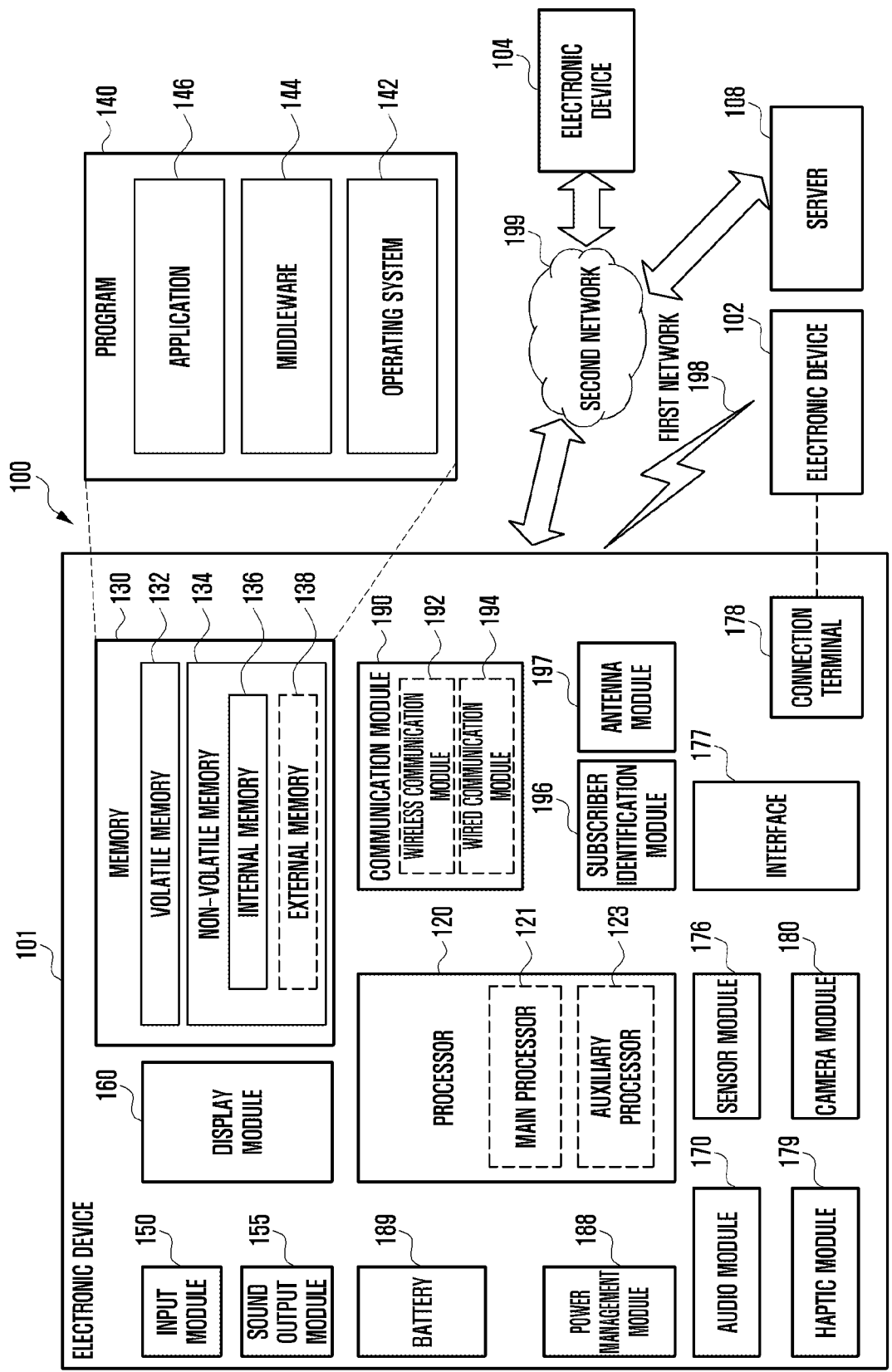
FIG. 1 is a block diagram illustrating an example electronic device in a network environment according to various embodiments.

FIG. 1 is a block diagram illustrating an example electronic device in a network environment according to various embodiments. Referring to FIG. 1, an electronic device 101 in a network environment 100 may communicate with an electronic device 102 via a first network 198 (e.g., a short-range wireless communication network), or at least one of an electronic device 104 or a server via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter(mm) Wave band) to achieve, e.g., a high data transmission rate. The wireless communication module 192 may support various technologies for securing performance on a high-frequency band, such as, e.g., beam-forming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server may be included in the second network 199. The electronic device 101 may be applied to intelligent services (e.g., smart home, smart city, smart car, or healthcare) based on 5G communication technology or IoT-related technology.

Figure 2A:
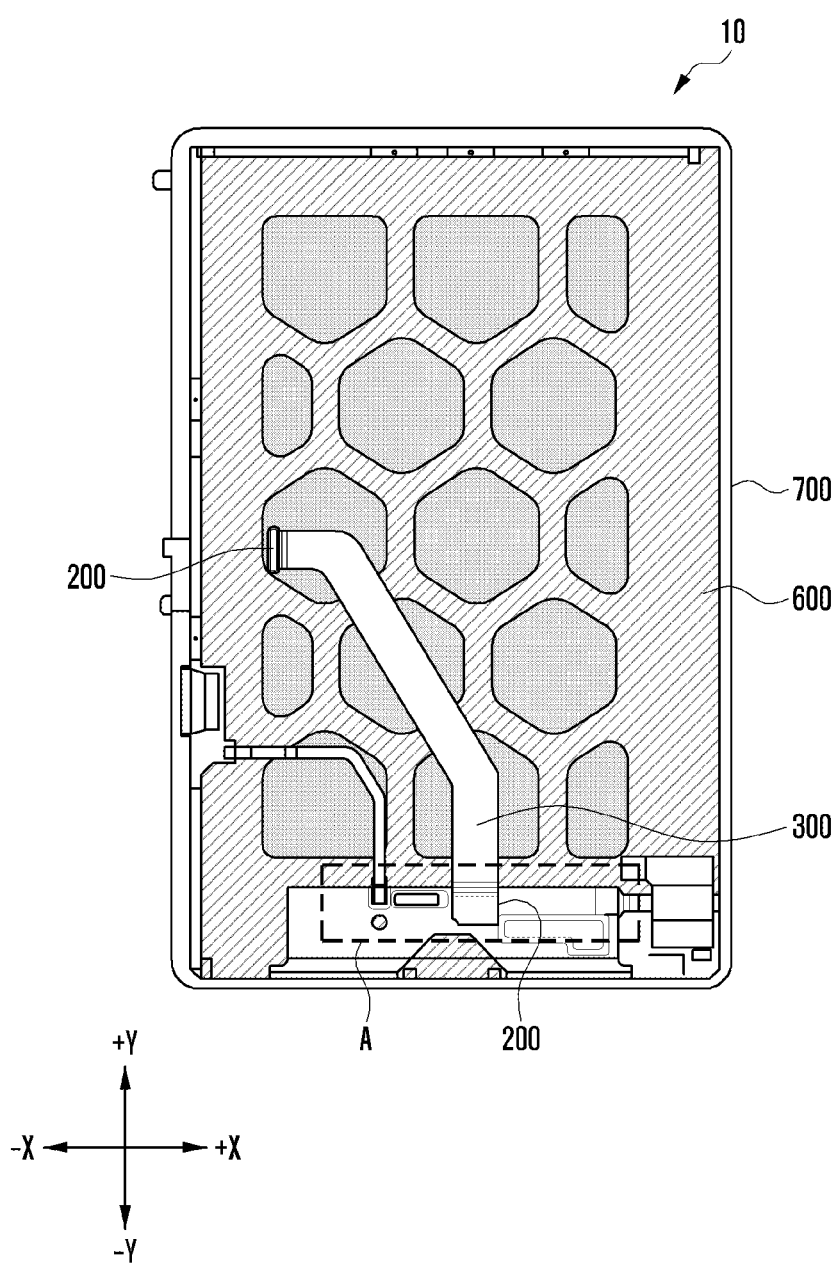
FIGS. 2A and 2B are diagrams illustrating an electronic device including a flexible printed circuit board according to various embodiments.

FIG. 2A is a diagram illustrating an electronic device 10 including a flexible printed circuit board 300 according to various embodiments.

Figure 2B:
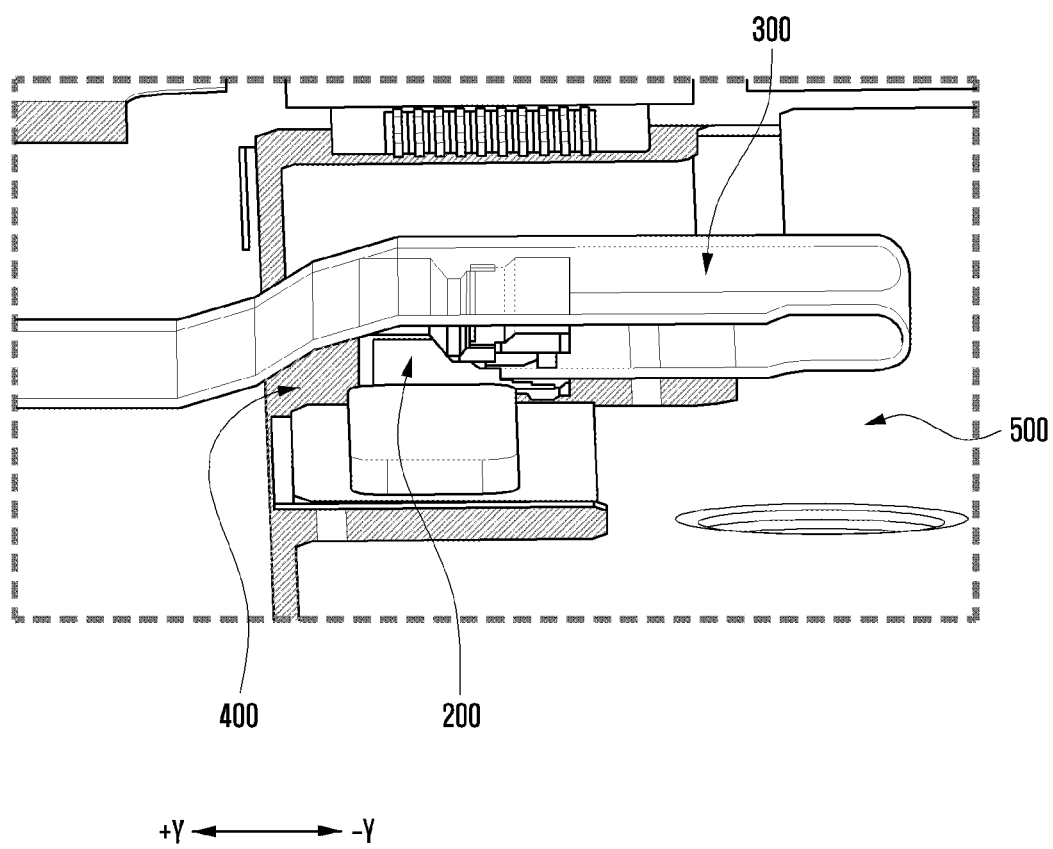

FIG. 2B is a diagram illustrating a connector 200 and the flexible printed circuit board 300 according to various embodiments.

FIG. 2B illustrates the electronic device 10 included in the box line A of FIG. 2A according to various embodiments.

According to various embodiments, the electronic device 101 (see FIG. 1) may include the electronic device 10 shown in FIG. 2A. The electronic device 10 shown in FIG. 2A is illustrated by way of example, and the electronic device (see FIG. 1) may include any other type electronic device (e.g., a notebook PC).

The longitudinal direction of the electronic device 10 according to various embodiments of the disclosure may refer to a direction in which the length of the electronic device 10 is relatively long. For example, the longitudinal direction of the electronic device 10 may refer to the positive y-axis direction. The width direction of the electronic device 10 may refer to a direction in which the electronic device 10 extends relatively short. For example, the width direction of the electronic device 10 may refer to the positive x-axis direction.

With reference to FIGS. 2A and 2B, the electronic device 10 may include the connector 200, the flexible printed circuit board 300, and/or a printed circuit board 400.

In various embodiments, the printed circuit board 400 may include the processor (see FIG. 1) and the memory 130 (see FIG. 1) in at least a part thereof. The processor 120 may include, for example, one or more of a central processing unit, an application processor, a graphic processing unit, an image signal processor, a sensor hub processor, and a communication processor. The memory may include, for example, a volatile memory or a non-volatile memory.

With reference to FIG. 2B, the electronic device 10 may include a protective film 500 for protecting the printed circuit board 400. For example, the protective film 500 may be disposed on one surface of the printed circuit board 400 and prevents and/or reduces the printed circuit board 400 from being damaged by an external impact.

In various embodiments, one end and the other end of the flexible printed circuit board 300 may be electrically connected to the printed circuit board 400 using the connector 200.

In various embodiments, the connector 200 connected to one end of the flexible printed circuit board 300 (e.g., the end of the flexible printed circuit board 300 shown in the box line A) may be a zero insertion force (ZIF) connector. The ZIF connector does not require force to connect or disconnect a connecting device (e.g., the flexible printed circuit board 300) to or from the ZIF connector, and the connecting device may be connected to or disconnected from the ZIF connector by a separate device (e.g., a fastening member 230, see FIG. 3). The flexible printed circuit board 300 may be electrically connected at one end thereof to the printed circuit board 400 using the connector 200.

In various embodiments, the connector 200 connected to the other end of the flexible printed circuit board 300 (e.g., the end of the flexible printed circuit board 300 extending in the negative x-axis direction in FIG. 2A) may be a board-to-board (BtoB) connector. The BtoB connector may refer, for example, to a device for connecting printed circuit boards to each other and may be a device in which a male connector is inserted into and connected to a female connector. The flexible printed circuit board 300 may be electrically connected at the other end thereof to the printed circuit board 400 using the connector 200.

In various embodiments, the electronic device 10 may include a backlight unit and/or a cover glass 700. The backlight unit 600 may supply light to a display (not shown) of the electronic device 10. The cover glass 700 may protect the display (not shown).

In various embodiments, the connector 200 may be disposed on at least a part of the printed circuit board 400. With reference to FIG. 2B, the connector 200 may be disposed on one surface of the printed circuit board 400. The printed circuit board 400 shown in FIG. 2B may include a display driving circuit (not shown).

In various embodiments, the protective film 500 may be disposed on at least a part of the printed circuit board 400. For example, the protective film 500 may be disposed on one surface of the printed circuit board 400. With reference to FIG. 2B, the protective film 500 may be disposed on one surface of the printed circuit board 400 excluding the portion where the connector 200 is disposed.

In various embodiments, the flexible printed circuit board 300 may be bent in at least a part thereof and extend. For example, with reference to FIG. 2B, the flexible printed circuit board 300 may extend in the negative y-axis direction, then be bent in at least a part thereof, and extend again in the opposite direction (e.g., the positive y-axis direction).

Although FIG. 2B shows that the flexible printed circuit board 300 is bent and extended from the negative y-axis direction and to the positive y-axis direction, this is merely an example. The extension form of the flexible printed circuit board 300 may not be limited thereto.

In various embodiments, the flexible printed circuit board 300 may be connected to the connector 200 at one end thereof. For example, with reference to FIG. 2B, the flexible printed circuit board 300 may extend in the positive y-axis direction and then connected to the connector 200 at one end. Being connected to the connector 200, the flexible printed circuit board 300 may be electrically connected to the printed circuit board 400.

Figure 3:
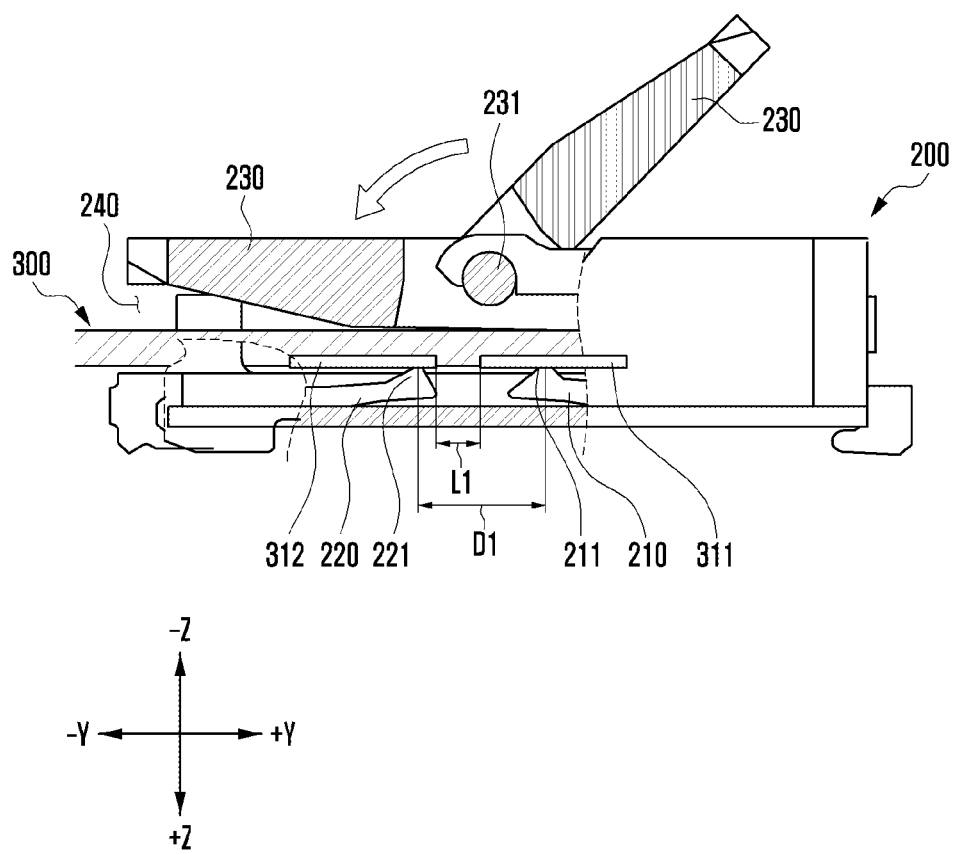
FIG. 3 is a diagram illustrating a connector and a flexible printed circuit board connected to the connector according to various embodiments.

FIG. 3 is a diagram illustrating a connector 200 and a flexible printed circuit board 300 connected to the connector 200 according to various embodiments.

In describing the connector 200 according to various embodiments of the disclosure, a direction in which the length of the connector 200 is relatively long may refer to the longitudinal direction of the connector 200, and a direction in which the length of the connector 200 is relatively short may refer to the height direction of the connector 200. For example, the longitudinal direction of the connector 200 may be the positive y-axis direction, and the height direction of the connector 200 may be the negative z-axis direction.

With reference to FIG. 3, the connector 200 according to various embodiments of the disclosure may include a first contact portion 210, a second contact portion 220, a fastening member 230, and/or a fastening space 240.

In various embodiments, the first contact portion 210 and the second contact portion 220 may be positioned to be spaced apart from each other in the longitudinal direction of the connector 200. The fastening space 240 may be formed at a position in the height direction (e.g., the negative z-axis direction) of the connector 200 with respect to the first and second contact portions 210 and 220. The fastening space 240 may be a space into which the flexible printed circuit board 300 is inserted. The fastening member 230 may be positioned in the height direction (e.g., the negative z-axis direction) of the connector 200 with respect to the fastening space 240.

In various embodiments, the flexible printed circuit board 300 may be inserted into the fastening space 240 of the connector 200. In order for the flexible printed circuit board 300 to be inserted into the fastening space 240, a length in the z-axis direction of the fastening space 240 may be greater than a length in the z-axis direction of the flexible printed circuit board 300.

In various embodiments, the connector 200 may include the fastening member in at least a part thereof. The fastening member 230 may fix the flexible printed circuit board 300 inserted into the connector 200. The fastening member may be rotatable based on a central axis 231.

In various embodiments, the fastening member 230 may rotate in a direction toward the flexible printed circuit board 300 with respect to the central axis 231. As the fastening member 230 rotates, it may come into contact with at least a part of the flexible printed circuit board 300, and the position of the flexible printed circuit board 300 may be fixed. As the position of the flexible printed circuit board 300 is fixed, at least a part of the flexible printed circuit board 300 may come into contact with the first and second contact portions 210 and 220 of the connector 200.

In various embodiments, the connector 200 may include the first contact portion and/or the second contact portion 220 in at least a part thereof. At least a part of the first and second contact portions 210 and 220 may come into contact with at least a part of the flexible printed circuit board 300.

In various embodiments, when at least a part of the first and second contact portions 210 and 220 is in contact with at least a part of the flexible printed circuit board 300, the connector 200 and the flexible printed circuit board 300 may be electrically connected.

In various embodiments, the first contact portion 210 may have a first contact point 211 that is to be in contact with at least a part of the flexible printed circuit board 300. The first contact point 211 may be a region of the first contact portion protruding in a direction in which the flexible printed circuit board 300 is disposed.

In various embodiments, the second contact portion 220 may have a second contact point 221 that is to be in contact with at least a part of the flexible printed circuit board 300. The second contact point 221 may be a region of the second contact portion 220 protruding in a direction in which the flexible printed circuit board 300 is disposed.

In various embodiments, the first contact point 211 and the second contact point may be disposed with a contact point distance D1 in the longitudinal direction (e.g., the positive y-axis direction) of the connector 200. For example, the first contact point 211 may be disposed at a position spaced apart from the second contact point 221 by the contact point distance D1 in the longitudinal direction of the connector 200.

In various embodiments, the flexible printed circuit board 300 may include a first terminal 311 and/or a second terminal 312. The first terminal 311 may come into contact with the first contact point 211 of the connector 200, and the second terminal 312 may come into contact with the second contact point 221 of the connector 200.

In various embodiments, the first terminal 311 may be disposed to be spaced apart from the second terminal 312 in the longitudinal direction (e.g., the positive y-axis direction) of the connector 200. For example, the first terminal may be disposed at a position spaced apart from the second terminal 312 by a first length L1 in the longitudinal direction of the connector 200.

Figure 5:
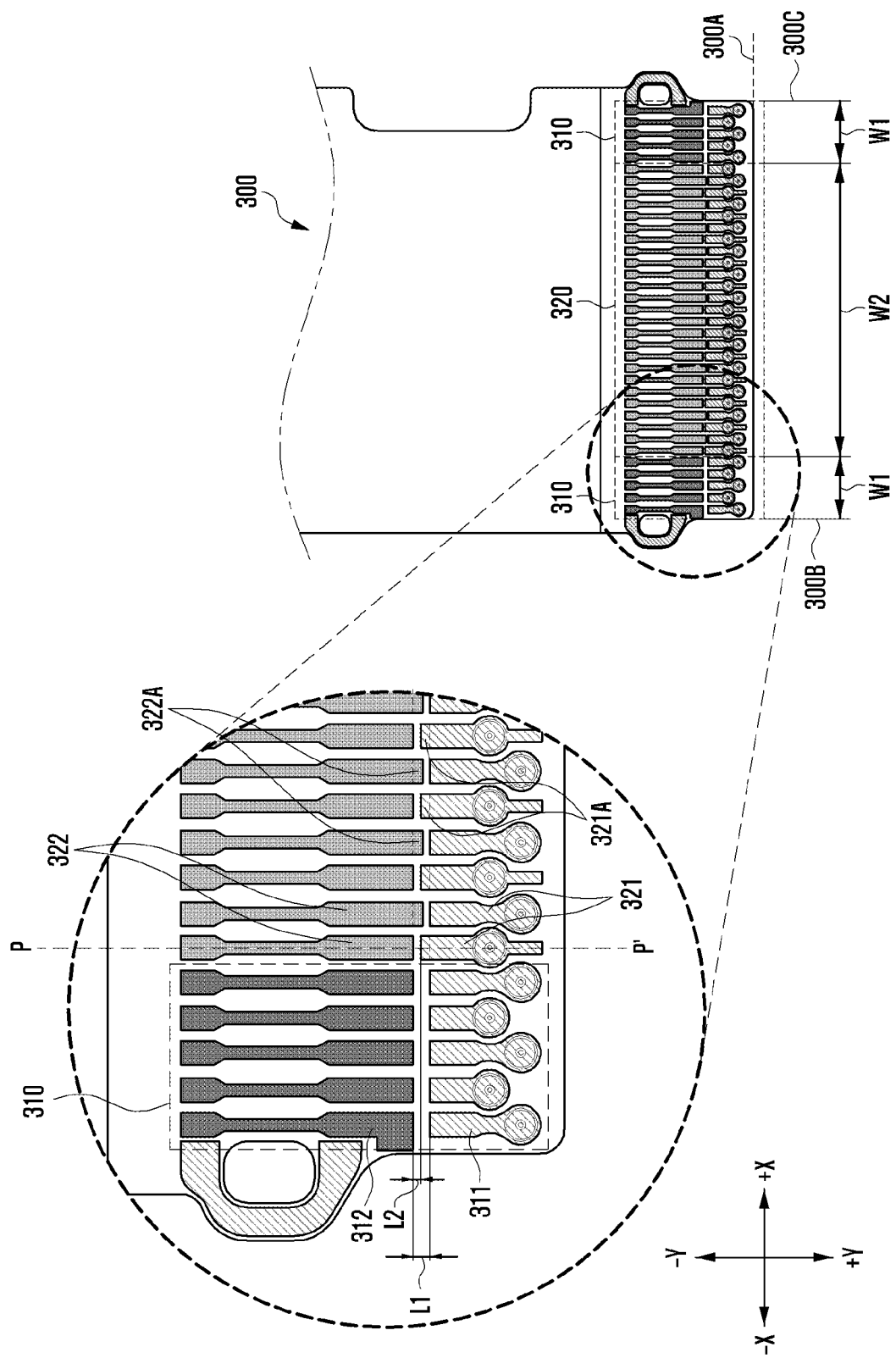
FIG. 5 is a diagram illustrating an example flexible printed circuit board according to various embodiments.

In various embodiments, a gap between the first contact portion 210 and the second contact portion 220 may be formed to be greater than the first length L1 and a second length L2 (see FIG. 5). The gap between the first contact portion and the second contact portion 220 may refer to a distance between the first contact point 211 included in the first contact portion 210 and the second contact point 221 included in the second contact portion 220. The contact point distance D1 between the first contact point 211 and the second contact point 221 may be greater than the first length L1 and the second length L2 (see FIG. 5).

In various embodiments, the first contact portion 210 may have a plurality of first contact points 211. The plurality of first contact points 211 may come into contact with the plurality of first terminals 311, respectively.

In various embodiments, the second contact portion 220 may have a plurality of second contact points 221. The plurality of second contact points 221 may come into contact with the plurality of second terminals 312, respectively.

Figure 4A:
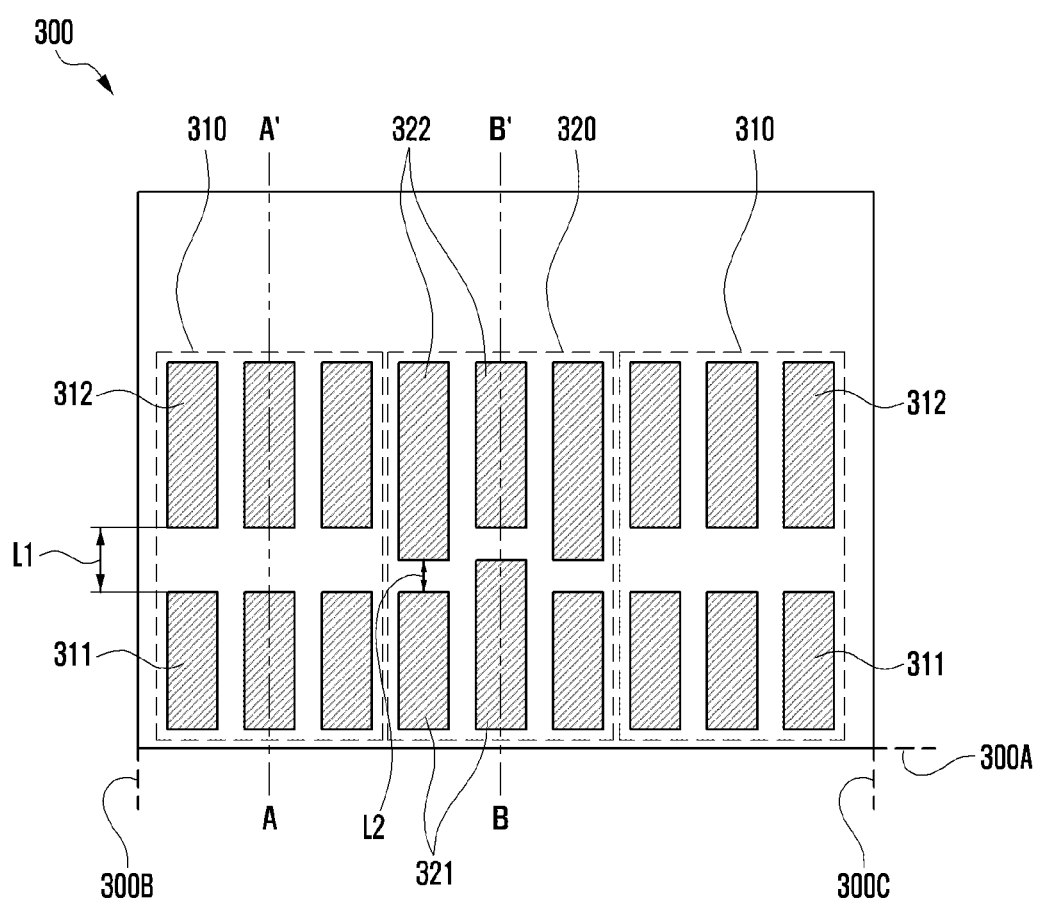
FIGS. 4A, 4B, and 4C are diagrams illustrating an example flexible printed circuit board including a first area and a second area according to various embodiments.

FIG. 4A is a diagram illustrating an example flexible printed circuit board 300 including a first area 310 and a second area 320 according to various embodiments.

Figure 4B:
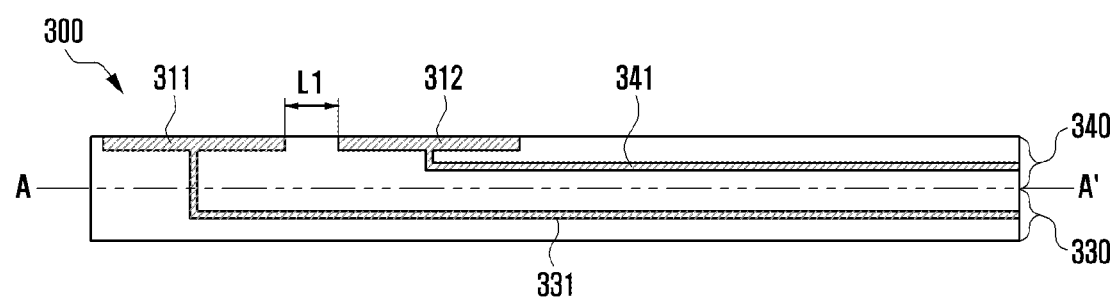
Figure 4B:
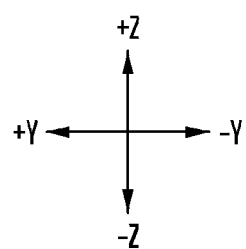

FIG. 4B is a cross-sectional view illustrating the flexible printed circuit board taken along the cross-section A-A' shown in FIG. 4A according to various embodiments.

Figure 4C:
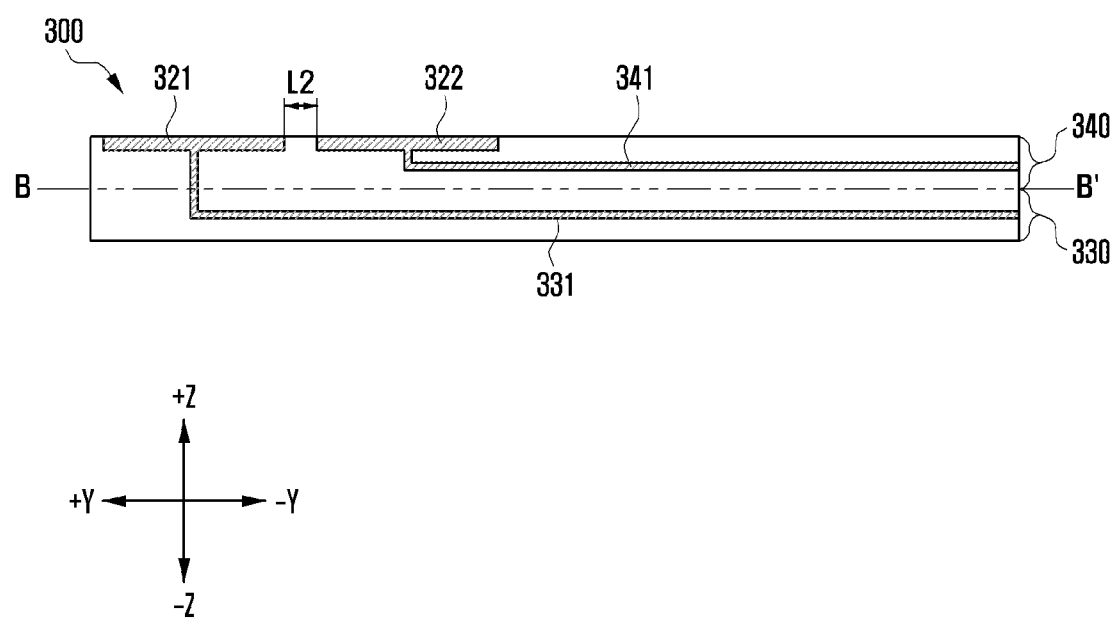

FIG. 4C is a cross-sectional view illustrating the flexible printed circuit board taken along the cross-section B-B' shown in FIG. 4A according to various embodiments.

The width direction of the flexible printed circuit board 300 according to various embodiments of the disclosure may refer to the positive x-axis direction, and the longitudinal direction may refer to the positive y-axis direction.

In various embodiments, the flexible printed circuit board 300 may have the first area 310 and/or the second area 320.

In various embodiments, the first area 310 may be a region located adjacent to one side 300B or the other side 300C of the flexible printed circuit board 300 on one surface of the flexible printed circuit board 300. For example, the first area 310 may refer to a region formed on one surface of the flexible printed circuit board 300 and formed to have a certain length in the width direction of the flexible printed circuit board 300 from one side 300B or the other side 300C of the one surface of the flexible printed circuit board 300.

In various embodiments, the flexible printed circuit board 300 may have two first areas 310. The two first areas 310 may be positioned adjacent to one side 300B and the other side 300C of the flexible printed circuit board 300, respectively, and formed in a symmetrical shape.

In various embodiments, the second area 320 may be a region formed between the two first areas 310. For example, with reference to FIG. 4A, the second area may be formed at a position spaced apart from one side 300B and the other side 300C of the flexible printed circuit board 300 in the width direction (e.g., the positive x-axis direction) and its opposite direction of the flexible printed circuit board 300.

In various embodiments, the first area 310 may include a plurality of first terminals 311 and second terminals 312. The plurality of first terminals 311 may be located in one end portion of the flexible printed circuit board 300. For example, the plurality of first terminals 311 may be positioned to be spaced apart from one end 300A of the flexible printed circuit board 300 by a predetermined (e.g., specified) distance.

In various embodiments, the second terminal 312 of the first area 310 may be positioned to be spaced apart from the first terminal 311. For example, in the first area 310, the first terminal 311 and the second terminal 312 may be positioned to be spaced apart by the first length L1 in the longitudinal direction of the flexible printed circuit board 300.

In various embodiments, each of the first and second terminals 311 and 312 of the first area 310 may have a rectangular shape extending in the longitudinal direction and the width direction of the flexible printed circuit board 300.

In various embodiments, the second area 320 may include a plurality of first terminals 321 and second terminals 322. The plurality of first terminals 321 may be located in one end portion of the flexible printed circuit board 300. For example, the plurality of first terminals 321 may be positioned to be spaced apart from one end 300A of the flexible printed circuit board 300 by a predetermined distance.

In various embodiments, the second terminal 322 of the second area 320 may be positioned to be spaced apart from the first terminal 321. For example, in the second area 320, the first terminal 321 and the second terminal 322 may be positioned to be spaced apart by the second length L2 in the longitudinal direction of the flexible printed circuit board 300.

In various embodiments, each of the first and second terminals 321 and 322 of the second area 320 may have a rectangular shape extending in the longitudinal direction and the width direction of the flexible printed circuit board 300.

In various embodiments, at least some of the first terminals 321 of the second area 320 may be formed to extend longer in the longitudinal direction (e.g., the positive y-axis direction) of the flexible printed circuit board 300 compared to the first terminals 311 of the first area 310.

In various embodiments, at least some of the second terminals 322 of the second area 320 may be formed to extend longer in the longitudinal direction (e.g., the positive y-axis direction) of the flexible printed circuit board 300 compared to the second terminals 312 of the first area 310.

In various embodiments, the plurality of first terminals 311 and 321 and the second terminals 312 and 322 may be disposed at predetermined intervals in the width direction of the flexible printed circuit board 300.

In various embodiments, a counterpart terminal may refer to a terminal positioned to be spaced apart from each terminal in the longitudinal direction of the flexible printed circuit board 300. For example, the counterpart terminals of the second terminals 312 and 322 may refer to the first terminals 311 and 321 positioned to be spaced apart from the second terminals 312 and 322 in the longitudinal direction of the flexible printed circuit board 300.

In various embodiments, the lengths (e.g., lengths in the y-axis direction) of the first and second terminals 321 and 322 of the second area 320 may vary depending on the arrangement positions of the first and second terminals 321 and 322. For example, among the first terminals 321 of the second area 320, a terminal having the same length (e.g., length in the y-axis direction) as the first terminal 311 of the first area 310 and a terminal having a greater length than the first terminal 311 of the first area 310 may be alternately disposed in the width direction (e.g., the positive x-axis direction) of the flexible printed circuit board 300. Also, among the second terminals 322 of the second area 320, a terminal having a greater length than the second terminal 312 of the first area 310 and a terminal having the same length (e.g., length in the y-axis direction) as the second terminal 312 of the first area 310 may be alternately disposed in the width direction of the flexible printed circuit board 300.

With reference to FIG. 4A, although the positions of one end (e.g., each end facing the counterpart terminal) of the first terminals 321 of the second area 320 are shown to be not the same in the longitudinal direction of the flexible printed circuit board 300, this is merely an example, and the arrangement of the first terminals 321 may not be limited thereto. For example, in the second area 320, one ends of the plurality of first terminals 321 may be formed at the same position in the longitudinal direction of the flexible printed circuit board 300. The plurality of second terminals 322 may be disposed to be spaced apart from the plurality of first terminals 321 by the second length L2, respectively. One ends of the plurality of second terminals 322 may also be formed at the same position in the longitudinal direction of the flexible printed circuit board 300.

In various embodiments, the first terminals 311 and 321 and the second terminals 312 and 322 may include a conductive material. The first terminals and 321 and the second terminals 312 and 322 made of a conductive material may come into contact with the first contact point 211 (see FIG. 3) and the second contact point 221 (see FIG. 3) of the connector 200 (see FIG. 3), so that the connector 200 and the flexible printed circuit board 300 may be electrically connected.

FIG. 4B is a cross-sectional view of the flexible printed circuit board 300 in the first area 310 shown in FIG. 4A according to various embodiments.

In various embodiments, the thickness direction of the flexible printed circuit board 300 may refer to the positive z-axis direction. One surface of the flexible printed circuit board 300 may refer to a surface of the flexible printed circuit board 300 facing the positive z-axis.

In various embodiments, the flexible printed circuit board 300 may include a first layer 330 and/or a second layer 340.

In various embodiments, the second layer 340 may be stacked on one surface of the first layer 330. One surface of the first layer 330 may refer to a surface facing the positive z-axis direction with respect to the first layer 330.

In various embodiments, the first layer 330 may include a first conductive line 331. The first conductive line 331 may be formed to extend in the longitudinal direction (e.g., the positive y-axis direction) of the flexible printed circuit board 300. The first conductive line 331 may be bent and extended in the thickness direction (e.g., the positive z-axis direction) of the flexible printed circuit board in at least a part thereof. The first conductive line 331 extended in the thickness direction (e.g., the positive z-axis direction) of the flexible printed circuit board 300 may be connected to the first terminal 311 of the first area 310 at one end thereof.

In various embodiments, the second layer 340 may include a second conductive line 341. The second conductive line 341 may be formed to extend in the longitudinal direction (e.g., the positive y-axis direction) of the flexible printed circuit board 300. The second conductive line 341 may be bent and extended in the thickness direction (e.g., the positive z-axis direction) of the flexible printed circuit board 300 in at least a part thereof. The second conductive line 341 extended in the thickness direction (e.g., the positive z-axis direction) of the flexible printed circuit board 300 and may be connected to the second terminal of the first area 310 at one end thereof.

In various embodiments, the first conductive line 331 and the second conductive line 341 are spaced apart from each other in the thickness direction (e.g., the positive z-axis direction) of the flexible printed circuit board 300 and may extend in the longitudinal direction of the flexible printed circuit board 300.

With reference to FIG. 4B, the first terminal 311 and the second terminal 312 of the first area 310 may be formed on one surface of the flexible printed circuit board 300. In the first area 310, the first terminal 311 may be disposed to be spaced apart from the second terminal 312 by the first length L1 in the longitudinal direction (e.g., the positive y-axis direction) of the flexible printed circuit board 300.

FIG. 4C is a cross-sectional view of the flexible printed circuit board 300 in the second area 320 shown in FIG. 4A according to various embodiments.

In various embodiments, the first layer 330 may include the first conductive line 331. The second layer 340 may include the second conductive line 341.

In various embodiments, the first conductive line 331 may be connected to the first terminal 321 of the second area 320 at one end thereof. The second conductive line 341 may be connected to the second terminal 322 of the second area 320 at one end thereof.

With reference to FIG. 4C, the first terminal 321 and the second terminal 322 of the second area 320 may be formed on one surface of the flexible printed circuit board 300. In the second area 320, the first terminal 321 may be disposed to be spaced apart from the second terminal 322 by the second length L2 in the longitudinal direction (e.g., the positive y-axis direction) of the flexible printed circuit board 300.

In various embodiments, the first length L1 illustrated in FIG. 4B may be greater than the second length L2 illustrated in FIG. 4C.

In various embodiments, the first conductive line 331 and the second conductive line 341 may be formed in plural. The plurality of first conductive lines 331 may be respectively connected to the plurality of first terminals 311 and 321. The plurality of second conductive lines 341 may be respectively connected to the plurality of second terminals 312 and 322.

In an embodiment, the plurality of second conductive lines 341 may be connected to one second terminal 312 or 322. For example, two second conductive lines 341 may be connected to one second terminal 312 or 322.

FIG. 5 is a diagram illustrating an example flexible printed circuit board 300 according to various embodiments.

The width direction of the flexible printed circuit board 300 according to various embodiments of the disclosure may refer to the positive x-axis direction, and the length direction may refer to the positive y-axis direction.

With reference to FIG. 5, the flexible printed circuit board 300 may include the first area 310 and/or the second area 320.

In various embodiments, the first area 310 may be a region located adjacent to one side 300B or the other side 300C of the flexible printed circuit board 300 on one surface of the flexible printed circuit board 300. For example, the first area 310 may refer to a region formed on one surface of the flexible printed circuit board 300 and formed to have a certain length in the width direction of the flexible printed circuit board 300 from one side 300B or the other side 300C of the one surface of the flexible printed circuit board 300.

In various embodiments, the flexible printed circuit board 300 may have two first areas 310. The two first areas 310 may be positioned adjacent to one side 300B and the other side 300C of the flexible printed circuit board 300, respectively, and formed in a symmetrical shape.

In various embodiments, the second area 320 may be a region formed between the two first areas 310 of the flexible printed circuit board 300. For example, with reference to FIG. 5, the second area 320 may be formed at a position spaced apart from one side 300B and the other side 300C of the flexible printed circuit board 300 in the width direction (e.g., the positive x-axis direction) and its opposite direction of the flexible printed circuit board 300.

In various embodiments, the first area 310 may include a plurality of first terminals 311 and second terminals 312.

In various embodiments, the plurality of first terminals 311 may be located adjacent to one end 300A of the flexible printed circuit board 300. For example, the plurality of first terminals 311 may be positioned to be spaced apart from one end 300A of the flexible printed circuit board 300 by a predetermined distance in the longitudinal direction of the flexible printed circuit board 300.

In various embodiments, the second terminal 312 included in the first area 310 may be positioned to be spaced apart from the first terminal 311. For example, in the first area 310, the first terminal 311 and the second terminal 312 may be positioned to be spaced apart by the first length L1 in the longitudinal direction of the flexible printed circuit board 300.

In various embodiments, each of the plurality of first and second terminals 311 and 312 may have a rectangular shape extending in the longitudinal direction and the width direction of the flexible printed circuit board 300.

In various embodiments, the plurality of first and second terminals 311 and 312 may be disposed at predetermined intervals in the width direction of the flexible printed circuit board 300.

In an embodiment, five first terminals 311 and five second terminals 312 may be formed in one first area 310. With reference to FIG. 5, the five first terminals and the five second terminals 321 may be formed at positions adjacent to one side 300B of one surface of the flexible printed circuit board 300. Although FIG. 5 shows that the five first terminals 311 and the five second terminals 312 are formed at positions adjacent to one side 300B of one surface of the flexible printed circuit board 300, the number of the first terminals 311 and the number of the second terminals 312 are not limited thereto and may be formed of five or more.

In various embodiments, one ends (e.g., each end facing the second terminal 312) of the plurality of first terminals 311 included in the first area 310 may be formed at the same position in the longitudinal direction of the flexible printed circuit board 300.

In various embodiments, one ends (e.g., each end facing the first terminal 311) of the plurality of second terminals 312 included in the first area 310 may be formed at the same position in the longitudinal direction of the flexible printed circuit board 300.

In various embodiments, in the first area 310, a distance between one end of the first terminal 311 (e.g., an end facing the second terminal 312) and one end of the second terminal 312 (e.g., an end facing the first terminal 311) may be formed as the first length L1.

In various embodiments, the second area 320 may include a plurality of first terminals 321 and second terminals 322.

In various embodiments, the plurality of first terminals 321 in the second area may be located adjacent to one end 300A of the flexible printed circuit board 300. For example, the first terminals 321 may be positioned to be spaced apart from one end 300A of the flexible printed circuit board 300 by a predetermined distance in the longitudinal direction of the flexible printed circuit board 300.

In various embodiments, the plurality of second terminals 322 included in the second area 320 may be positioned to be spaced apart from the first terminals 321. For example, in the second area 320, the first terminal 321 and the second terminal 322 may be positioned to be spaced apart by the second length L2 in the longitudinal direction of the flexible printed circuit board 300.

In various embodiments, each of the plurality of first and second terminals 321 and 322 included in the second area 320 may have a rectangular shape extending in the longitudinal direction and the width direction of the flexible printed circuit board 300.

In various embodiments, the plurality of first and second terminals 321 and 322 included in the second area 320 may be disposed at predetermined intervals in the width direction of the flexible printed circuit board 300.

In various embodiments, the plurality of first and second terminals 321 and 322 included in the second area 320 may be arranged such that the positions of their one ends are alternately formed in the width direction of the flexible printed circuit board 300.

In various embodiments, the first terminal 321 and the second terminal 322 included in the second area 320 may alternately include extension regions 321A and 322A. The extension region 321A or 322A may refer to a region in which one end of the first terminal 321 or the second terminal 322 extends toward a counterpart terminal (e.g., the second terminal 322 or the first terminal 321). With reference to FIG. 5, the first terminal 321 located on the line P-P' includes the extension region 321A, and the next first terminal 321 spaced apart from the line P-P' in the width direction of the flexible printed circuit board 300 may not include the extension region 321A. Also, the next first terminal 321 spaced apart from the first terminal 321 not including the extension region 321A in the width direction of the flexible printed circuit board 300 may include the extension region 321A again. In this form, the first terminals 321 including or not including the extension region 321A may be alternately disposed at intervals in the width direction of the flexible printed circuit board 300.

With reference to FIG. 5, the second terminal 322 located on the line P-P' does not include the extension region 322A, and the next second terminal 322 spaced apart from the line P-P' in the width direction of the flexible printed circuit board may include the extension region 322A. Also, the next second terminal 322 spaced apart from the second terminal 322 including the extension region 322A in the width direction of the flexible printed circuit board 300 may not include the extension region 322A again. In this form, the second terminals 322 including or not including the extension region 322A may be alternately disposed at intervals in the width direction of the flexible printed circuit board 300.

In various embodiments, the plurality of first and second terminals 321 and 322 included in the second area 320 are disposed at intervals in the width direction of the flexible printed circuit board 300 and may alternately include the extension region 321A or 322A. For example, in the case that the first terminal includes the extension region 321A, the counterpart second terminal 322 may not include the extension region 322A. In the case that the first terminal does not include the extension region 321A, the counterpart second terminal may include the extension region 322A. Because the first terminals 321 and the second terminals 322 alternately include the extension regions 321A and 322A, a distance between the first and second terminals 321 and 322 in the second area 320 may be formed to be equal to the second length L2.

In various embodiments, in the case that the first and second terminals 321 and include the extended regions 321A and 322A in at least a part thereof, the rigidity of the flexible printed circuit board 300 may be improved. For example, the flexible printed circuit board 300 may be bent in a space formed between the first terminal 321 and the second terminal 322. The extension regions 321A and 322A may prevent/reduce the flexible printed circuit board 300 from being bent in the space formed between the first and second terminals 321 and 322. As the extension regions 321A and 322A prevent/reduce bending of the flexible printed circuit board 300, the rigidity of the flexible printed circuit board 300 may be improved.

In various embodiments, the flexible printed circuit board 300 may include the first area 310 by a predetermined ratio or more of the entire area. For example, the flexible printed circuit board 300 may include the first area 310 such that the ratio of the first area 310 among the first and second areas 310 and 320 is 30% or more. For example, when the ratio of the first area 310 is formed to be 30%, the first area 310 of 15% may be formed in a position adjacent to one side 300B of the flexible printed circuit board 300, and the first area 310 of the remaining 15% may be formed in a position adjacent to the other side 300C of the flexible printed circuit board 300.

In various embodiments, the first area 310 disposed adjacent to one side 300B of the flexible printed circuit board 300 may have the first width W1 in the width direction of the flexible printed circuit board 300. The second area 320 may have the second width W2 in the width direction of the flexible printed circuit board 300. The first area 310 disposed adjacent to the other side 300C of the flexible printed circuit board 300 may have the first width W1 in the width direction of the flexible printed circuit board 300. The first width W1 may be 15% or more of the width of the flexible printed circuit board 300.

In various embodiments, the first length L1 of the first area 310 may be greater than the second length L2 of the second area 320.

In various embodiments, the first length L1 may be formed to be twice as much as the second length L2. For example, the second length L2 may be formed to be 0.1 mm, and the first length L1 may be formed to be 0.2 mm.

Figure 6A:
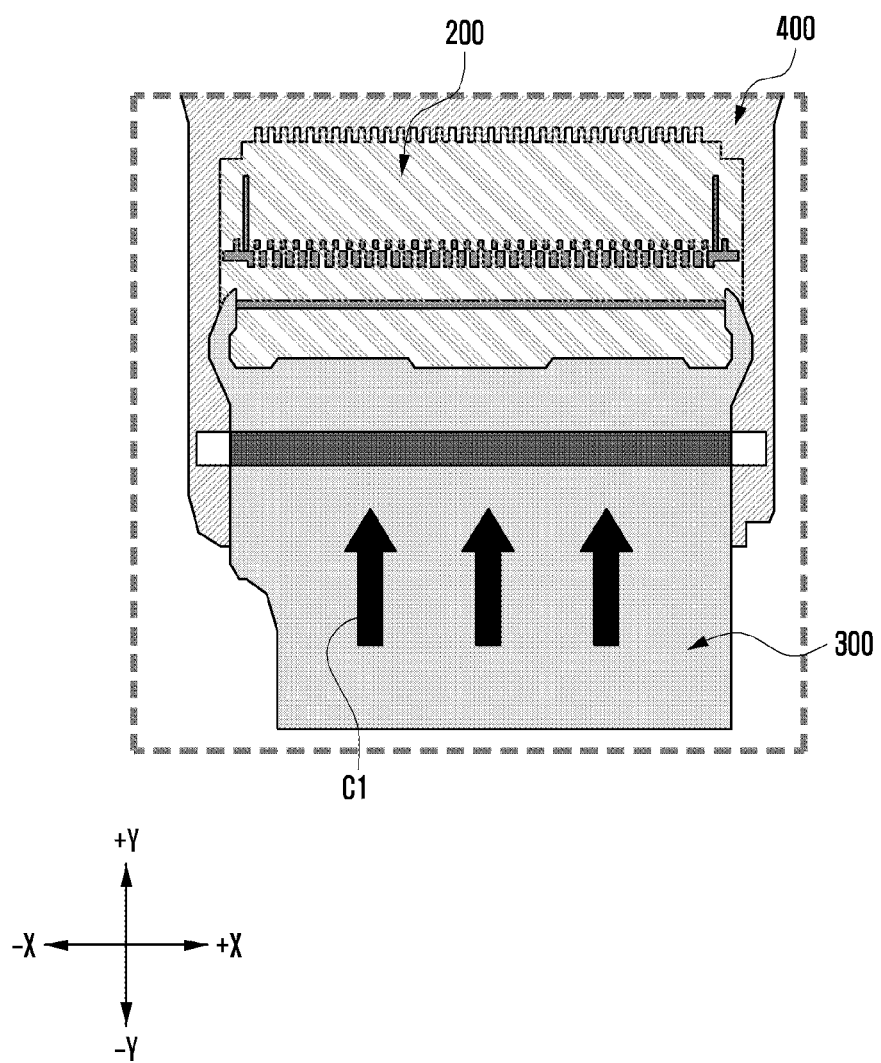
FIGS. 6A and 6B are diagrams illustrating a state (a first state) in which a flexible printed circuit board is completely connected to a connector according to various embodiments.

FIG. 6A is a diagram illustrating a state (a first state) in which a flexible printed circuit board 300 is completely connected to a connector 200 according to various embodiments.

Figure 6B:
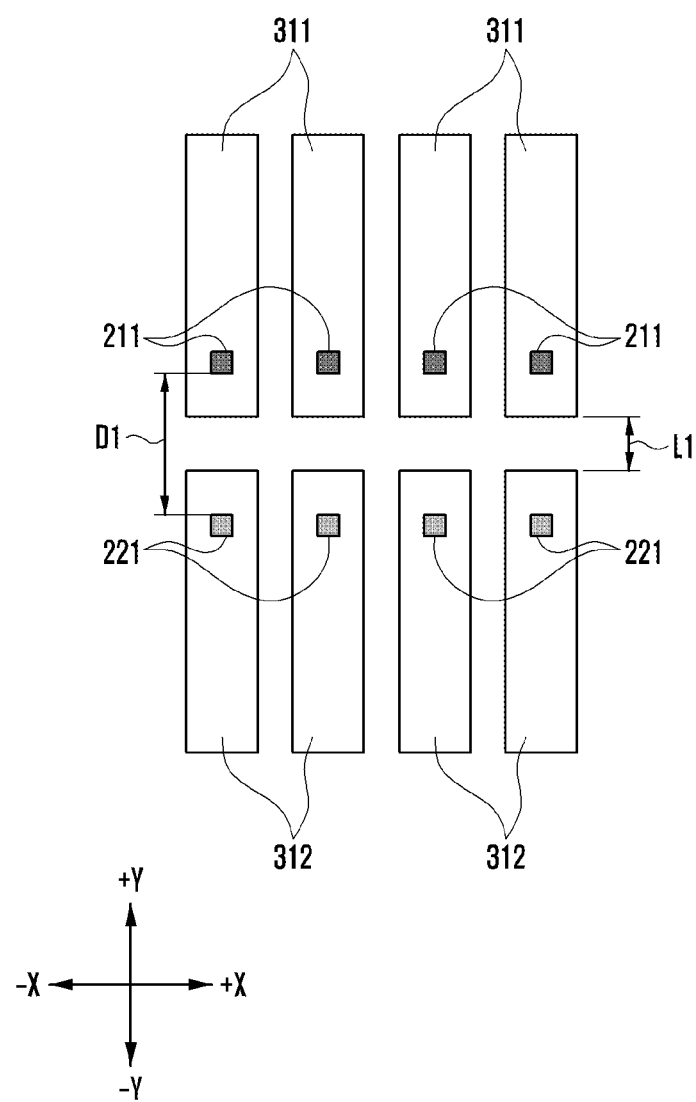

FIG. 6B is a diagram illustrating, in the first state, a contact relationship between the flexible printed circuit board 300 and the connector 200 according to various embodiments.

In various embodiments, at least a part of the flexible printed circuit board 300 may be inserted into the connector 200 and connected to the connector 200.

In various embodiments, the first state may refer to a state in which the flexible printed circuit board 300 is completely connected to the connector 200.

With reference to FIG. 6A, a first direction C1 indicates a direction in which the flexible printed circuit board 300 is moved to be connected to the connector 200 in the first state.

With reference to FIG. 6A, in the first state, as one end portion of the flexible printed circuit board 300 is inserted into the connector 200, the flexible printed circuit board 300 may be connected to the connector 200. In the first state, the flexible printed circuit board 300 may be moved in the first direction C1 and connected to the connector 200.

In various embodiments, the connector 200 may be disposed on one surface of the printed circuit board 400 and connected to the printed circuit board 400.

In various embodiments, in the first state, the flexible printed circuit board 300 may be connected to the connector 200 and electrically connected to the printed circuit board 400 connected to the connector 200.

FIG. 6B shows a contact relationship between the first and second contact points and 221 of the connector 200 and the first and second terminals 311 and in the first area 310 of the flexible printed circuit board 300.

In various embodiments, a gap between the first and second terminals 311 and in the first area 310 of the flexible printed circuit board 300 may be formed by the first length L1. The first and second contact points 211 and 221 of the connector 200 may have the contact point distance D1. The contact point distance D1 may be formed to be greater than the first length L1.

In various embodiments, in the first state, the first and second contact points 211 and 221 of the connector 200 may come into contact with the first and second terminals 311 and 312 of the flexible printed circuit board 300. For example, in the first state, the first contact point 211 may be located at a position corresponding to at least a part of the first terminal 311 and be in contact with the first terminal 311. The second contact point 221 may be located at a position corresponding to at least a part of the second terminal 312 and be in contact with the second terminal 312.

In the case that the first contact point 211 of the connector 200 is in contact with the second terminal 312 of the flexible printed circuit board 300, or the second contact point 221 of the connector 200 is in contact with the first terminal 311 of the flexible printed circuit board 300, a short may occur in a part of the flexible printed circuit board 300 and thereby a component (not shown) connected to the first terminal 311 or the second terminal 312 may be damaged.

With reference to FIG. 6B, because in the first state the first contact point 211 of the connector 200 is not in contact with the second terminal 312 of the flexible printed circuit board 300 and the second contact point 221 of the connector 200 is not in contact with the first terminal 311 of the flexible printed circuit board 300, a short does not occur in the flexible printed circuit board 300 and thereby damage to a component (not shown) connected to the first terminal 311 or the second terminal 312 may be prevented and/or reduced.

Figure 7A:
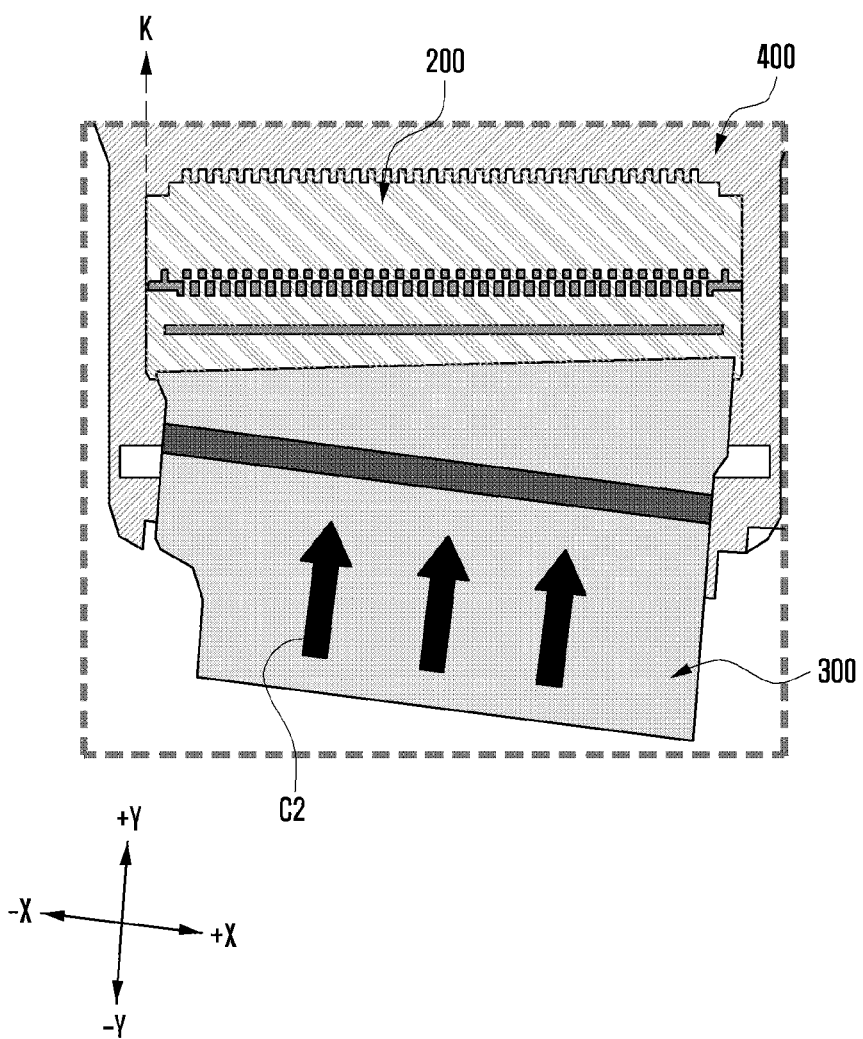
FIGS. 7A and 7B are diagrams illustrating a state (a second state) in which a flexible printed circuit board is connected to a connector in an inclined direction according to various embodiments.

FIG. 7A is a diagram illustrating a state (a second state) in which a flexible printed circuit board 300 is connected to a connector 200 in an inclined direction according to various embodiments.

Figure 7B:
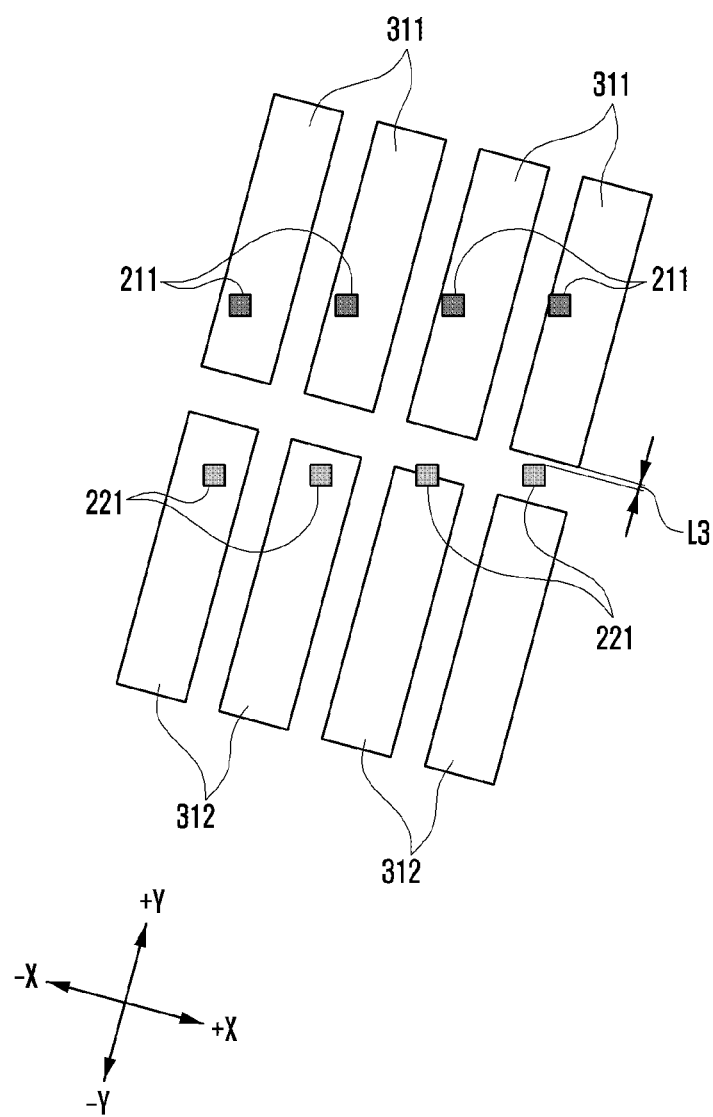

FIG. 7B is a diagram illustrating, in the second state, a contact relationship between the flexible printed circuit board 300 and the connector 200 according to various embodiments.

In various embodiments, the second state may refer to a state in which the flexible printed circuit board 300 is connected to the connector 200 in an inclined direction.

With reference to FIG. 7A, a second direction C2 of the flexible printed circuit board 300 indicates a direction in which the flexible printed circuit board 300 is moved to be connected to the connector 200 in the second state.

With reference to FIG. 7A, in the second state, as being inserted into the connector 200 in an inclined direction with respect to the connector 200, the flexible printed circuit board 300 may be connected to the connector 200. For example, in the second state, the flexible printed circuit board 300 may be moved in the second direction C2 and connected to the connector 200.

In the second state, the second direction C2 of the flexible printed circuit board may be a direction inclined from a direction in which the connector 200 is formed. For example, the connector 200 may extend in a virtual K-axis direction shown in FIG. 7A, but the second direction C2 in which the flexible printed circuit board 300 moves may be formed in a direction parallel to the longitudinal direction (e.g., the positive y-axis direction) of the flexible printed circuit board 300.

FIG. 7B shows a contact relationship between the first and second contact points and 221 of the connector 200 and the first and second terminals 311 and in the first area 310 of the flexible printed circuit board 300.

With reference to FIG. 7B, in the second state, because the flexible printed circuit board 300 is inserted into the connector 200 slantingly in the second direction C2, at least one of the plurality of second contact points 221 may not be in contact with the second terminal 312.

In the case that the first contact point 211 of the connector 200 is in contact with the second terminal 312 of the flexible printed circuit board 300, or the second contact point 221 of the connector 200 is in contact with the first terminal 311 of the flexible printed circuit board 300, a short may occur in a part of the flexible printed circuit board 300 and thereby a component (not shown) connected to the first terminal 311 or the second terminal 312 may be damaged.

With reference to FIG. 7B, in the second state, the plurality of second contact points 221 do not come into contact with the first terminals 311, respectively, while a separation distance is formed. For example, the second contact point located farthest in the positive x-axis direction among the plurality of second contact points 221 may have a separation distance from the adjacent first terminal 311 by the third length L3. In the second state, the plurality of first contact points 211 as well do not come into contact with the second terminals 312, respectively, while a separation distance is formed.

Because in the second state the first contact point 211 of the connector 200 is not in contact with the second terminal 312 of the flexible printed circuit board and also the second contact point 221 of the connector 200 is not in contact with the first terminal 311 of the flexible printed circuit board 300, a short does not occur in the flexible printed circuit board 300 and thereby damage to a component (not shown) connected to the first terminal 311 or the second terminal 312 may be prevented and/or reduced.

Figure 8A:
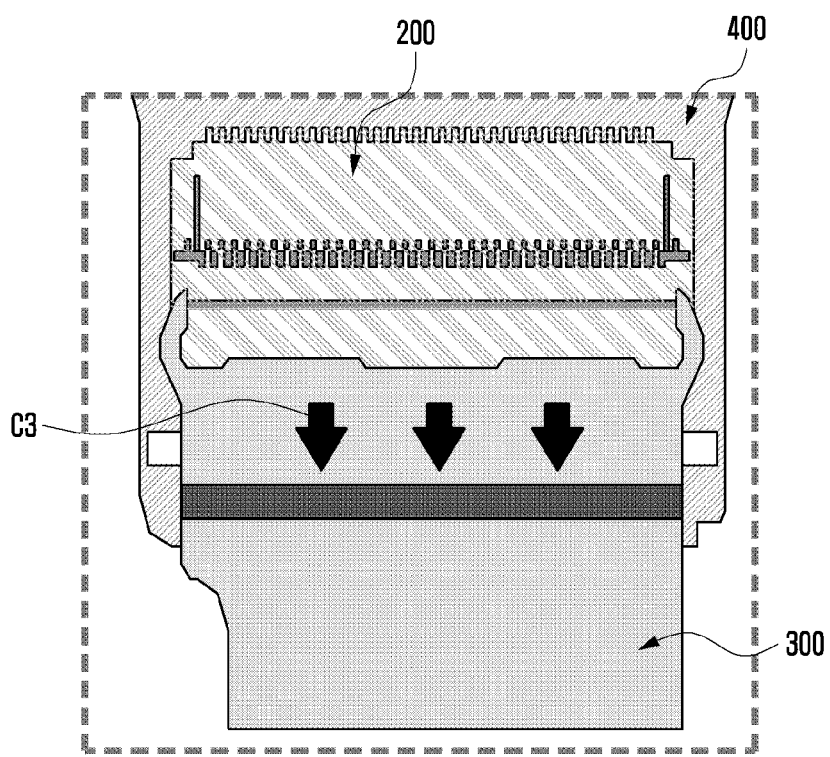
FIGS. 8A and 8B are diagrams illustrating a state (a third state) in which a flexible printed circuit board is not completely connected to a connector according to various embodiments.

FIG. 8A is a diagram illustrating a state (a third state) in which a flexible printed circuit board 300 is not completely connected to a connector 200 according to various embodiments.

Figure 8B:
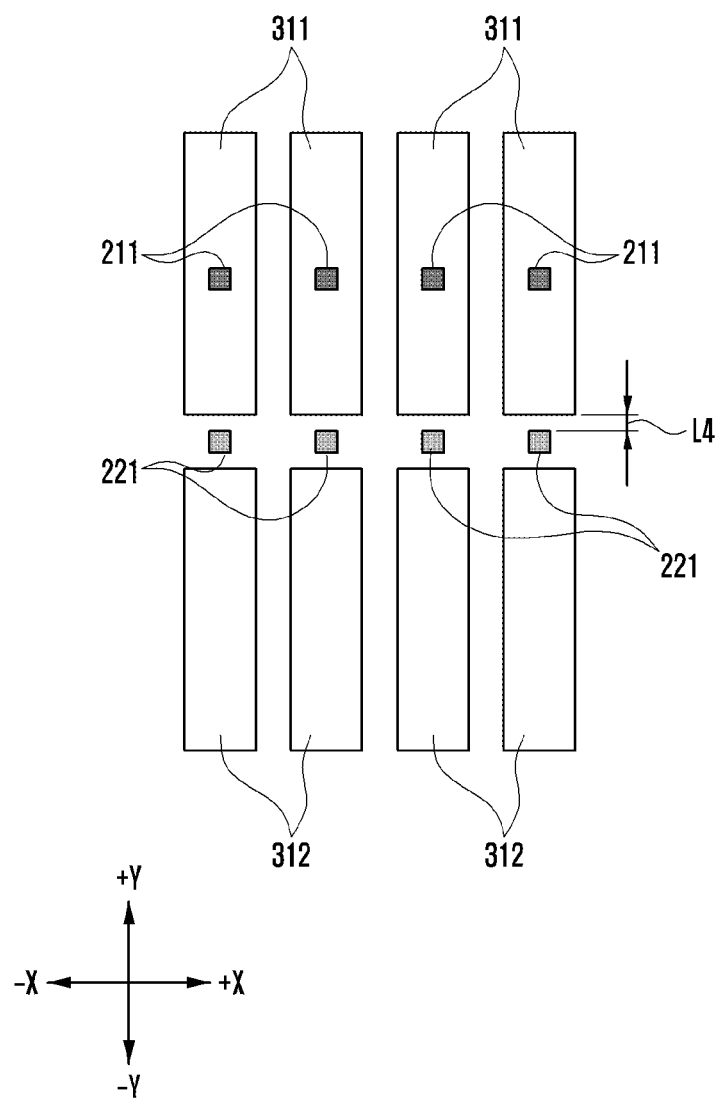

FIG. 8B is a diagram illustrating, in the third state, a contact relationship between the flexible printed circuit board 300 and the connector 200 according to various embodiments.

In various embodiments, the third state may refer to a state in which the flexible printed circuit board 300 is not completely connected to the connector 200.

With reference to FIG. 8A, a third direction C3 of the flexible printed circuit board 300 indicates a direction in which the flexible printed circuit board 300 is moved with respect to the connector 200 in the third state.

With reference to FIG. 8A, in the third state, the flexible printed circuit board may not be completely connected to the connector 200. For example, in the third state, the flexible printed circuit board 300 may be disposed at a position moved in the third direction C3 compared to a state (the first state, see FIG. 6A) in which it is completely connected to the connector 200.

FIG. 8B shows a contact relationship between the first and second contact points and 221 of the connector 200 and the first and second terminals 311 and of the flexible printed circuit board 300 in the third state.

With respect to FIG. 8B, because the flexible printed circuit board 300 is not completely inserted into the connector 200 in the third state, at least some of the plurality of second contact points 221 may not be in contact with the second terminal 312. For example, in the third state, the plurality of first contact points are in contact with the first terminals 311, respectively, but all of the plurality of second contact points 221 may not be in contact with the second terminals 312.

In the case that the first contact point 211 of the connector 200 is in contact with the second terminal 312 of the flexible printed circuit board 300, or the second contact point 221 of the connector 200 is in contact with the first terminal 311 of the flexible printed circuit board 300, a short may occur in a part of the flexible printed circuit board 300 and thereby a component (not shown) connected to the first terminal 311 or the second terminal 312 may be damaged.

With reference to FIG. 8B, in the third state, the plurality of second contact points 221 do not come into contact with the first terminals 311, respectively, while a separation distance is formed. For example, each of the plurality of second contact points 221 may form a separation distance from the adjacent first terminal 311 by the fourth length L4. In the third state, the plurality of first contact points 211 as well do not come into contact with the second terminals 312, respectively, while a separation distance is formed.

Because in the third state the first contact point 211 of the connector 200 is not in contact with the second terminal 312 of the flexible printed circuit board 300 and also the second contact point 221 of the connector 200 is not in contact with the first terminal 311 of the flexible printed circuit board 300, a short does not occur in the flexible printed circuit board 300 and thereby damage to a component (not shown) connected to the first terminal 311 or the second terminal 312 may be prevented and/or reduced.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, a home appliance, or the like. The electronic devices ac cording to embodiments of the disclosure are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates other wise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the component s in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., module or program) of the above-described components may include a singular or a plurality of entities, and some of the plurality of entities may be separately disposed in any other component. According to various embodiments, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to various embodiments, operations performed by a module, program, or other component may be executed sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a printed circuit board;
    a connector disposed on one surface of the printed circuit board and including a first contact portion and a second contact portion spaced apart from the first contact portion; and
    a flexible printed circuit board at least a part of which is connected to the connector,
    wherein the flexible printed circuit board includes:
    two first areas formed on one surface of the flexible printed circuit board and each having a length in a width direction from one side or the other side of the one surface; and
    a second area formed between the two first areas,
    wherein each of the first area and the second area includes:
    a plurality of first terminals in contact with the first contact portion and disposed at intervals in the width direction of the flexible printed circuit board; and
    a plurality of second terminals in contact with the second contact portion and spaced apart from the plurality of first terminals in a longitudinal direction of the flexible printed circuit board,
    wherein in the first area, one end of the plurality of first terminals are formed at a same position in the longitudinal direction of the flexible printed circuit board, and the plurality of second terminals are spaced apart from the plurality of first terminals by a first length, respectively,
    wherein in the second area, at least some of the plurality of first terminals are spaced apart from at least some of the plurality of second terminals by a second length, respectively, and
    wherein the first length is greater than the second length.

2. The electronic device of claim 1, wherein in the second area,
    the plurality of first terminals and the plurality of second terminals are disposed in the width direction of the flexible printed circuit board and alternately include an extension region extending from one end toward a counterpart terminal, and
    the plurality of second terminals are spaced apart from the plurality of first terminals by the second length, respectively.

3. The electronic device of claim 1, wherein in the second area,
    one end of the plurality of first terminals are formed at a same position in the longitudinal direction of the flexible printed circuit board, and the plurality of second terminals are spaced apart from the plurality of first terminals by the second length, respectively.

4. The electronic device of claim 1, further comprising:
a first layer including a first conductive line; and
a second layer stacked on one surface of the first layer and including a second conductive line spaced apart from the first conductive line in a thickness direction of the flexible printed circuit board,
wherein the first conductive line is connected to the first terminal, and the second conductive line is connected to the second terminal.

5. The electronic device of claim 1, wherein the first length is twice the second length.

6. The electronic device of claim 1, wherein the printed circuit board includes a display driving circuit.

7. The electronic device of claim 1, wherein a gap between the first contact portion and the second contact portion is greater than the first length and the second length.

8. The electronic device of claim 1, wherein the first contact portion of the connector includes a plurality of first contact points in contact with the plurality of first terminals, respectively, and
the second contact portion of the connector includes a plurality of second contact points in contact with the plurality of second terminals, respectively.

9. The electronic device of claim 8, wherein in a state in which the flexible printed circuit board is connected to the connector in an inclined direction,
each of the plurality of second contact points has a separation distance from the first terminal of the first area.

10. The electronic device of claim 8, wherein in a state in which the first terminals of the first area are in contact with the first contact points of the connector, respectively, and all of the second terminals of the first area are not in contact with the second contact points of the connector,
each of the plurality of second contact points has a separation distance from the first terminal of the first area.

11. A flexible printed circuit board connecting structure comprising:
a connector including a first contact portion and a second contact portion spaced apart from the first contact portion; and
a flexible printed circuit board at least a part of which is connected to the connector,
wherein the flexible printed circuit board includes:
two first areas formed on one surface of the flexible printed circuit board and each having a length in a width direction from one side or the other side of the one surface; and
a second area formed between the first areas,
wherein each of the first area and the second area includes:
a plurality of first terminals in contact with the first contact portion and disposed at intervals in the width direction of the flexible printed circuit board; and
a plurality of second terminals in contact with the second contact portion and spaced apart from the plurality of first terminals in a longitudinal direction of the flexible printed circuit board,
wherein in the first area, one end of the plurality of first terminals are formed at a same position in the longitudinal direction of the flexible printed circuit board, and the plurality of second terminals are spaced apart from the plurality of first terminals by a first length, respectively,
wherein in the second area, at least some of the plurality of first terminals are spaced apart from at least some of the plurality of second terminals by a second length, respectively, and
wherein the first length is greater than the second length.

12. The flexible printed circuit board connecting structure of claim 11, wherein in the second area,
the plurality of first terminals and the plurality of second terminals are disposed in the width direction of the flexible printed circuit board and alternately include an extension region extending from one end toward a counterpart terminal, and
the plurality of second terminals are spaced apart from the plurality of first terminals by the second length, respectively.

13. The flexible printed circuit board connecting structure of claim 11, wherein in the second area,
one end of the plurality of first terminals are formed at a same position in the longitudinal direction of the flexible printed circuit board, and the plurality of second terminals are spaced apart from the plurality of first terminals by the second length, respectively.

14. The flexible printed circuit board connecting structure of claim 11, further comprising:
a first layer including a first conductive line; and
a second layer stacked on one surface of the first layer and including a second conductive line spaced apart from the first conductive line in a thickness direction of the flexible printed circuit board,
wherein the first conductive line is connected to the first terminal, and the second conductive line is connected to the second terminal.

15. The flexible printed circuit board connecting structure of claim 11, wherein a gap between the first contact portion and the second contact portion is greater than the first length and the second length.

16. The flexible printed circuit board connecting structure of claim 11, wherein the first contact portion of the connector includes a plurality of first contact points in contact with the plurality of first terminals, respectively, and
the second contact portion of the connector includes a plurality of second contact points in contact with the plurality of second terminals, respectively, and
wherein in a state where the flexible printed circuit board is connected to the connector in an inclined direction, each of the plurality of second contact points has a separation distance from the first terminal of the first area.

17. A flexible printed circuit board comprising:
two first areas formed on one surface of the flexible printed circuit board and each having a length in a width direction from one side or the other side of the one surface; and
a second area formed between the first areas,
wherein each of the first area and the second area includes:
a plurality of first terminals disposed at intervals in the width direction of the flexible printed circuit board; and
a plurality of second terminals spaced apart from the plurality of first terminals in a longitudinal direction of the flexible printed circuit board,
wherein in the first area, one end of the plurality of first terminals are formed at a same position in the longitudinal direction of the flexible printed circuit board, and the plurality of second terminals are spaced apart from the plurality of first terminals by a first length, respectively, wherein in the second area, at least some of the plurality of first terminals are spaced apart from at least some of the plurality of second terminals by a second length, respectively, and wherein the first length is greater than the second length.

18. The flexible printed circuit board of claim 17, wherein in the second area, the plurality of first terminals and the plurality of second terminals are disposed in the width direction of the flexible printed circuit board and alternately include an extension region extending from one end toward a counterpart terminal, and the plurality of second terminals are spaced apart from the plurality of first terminals by the second length, respectively.

19. The flexible printed circuit board of claim 17, wherein in the second area, one end of the plurality of first terminals are formed at a same position in the longitudinal direction of the flexible printed circuit board, and the plurality of second terminals are spaced apart from the plurality of first terminals by the second length, respectively.

20. The flexible printed circuit board of claim 17, further comprising:

a first layer including a first conductive line; and a second layer stacked on one surface of the first layer and including a second conductive line spaced apart from the first conductive line in a thickness direction of the flexible printed circuit board, wherein the first conductive line is connected to the first terminal, and the second conductive line is connected to the second terminal.

\* \* \* \* \*